United States Patent [19]
Phillips et al.

[11] Patent Number: 5,897,980
[45] Date of Patent: Apr. 27, 1999

[54] METHOD OF IMPARTING CONTRAST ENHANCEMENT PROPERTIES TO DIFFUSING, DEPIXELATING OR PROJECTION SCREENS

[75] Inventors: Nicholas John Phillips, Loughborough; Christopher A. Barnett, Abergavenny; Robin Clabburn, Sevenhampton, all of United Kingdom

[73] Assignees: Nashua Corporation, Nashua, N.H.; Nahsua Photo Limited, United Kingdom

[21] Appl. No.: 08/680,319

[22] Filed: Jul. 11, 1996

[30] Foreign Application Priority Data

Jul. 14, 1995 [GB] United Kingdom .................. 9514440

[51] Int. Cl.⁶ ....................................... G03F 9/00
[52] U.S. Cl. .............................. 430/6; 430/126; 430/252; 430/254
[58] Field of Search .................................. 430/126, 252, 430/6, 254

[56] References Cited

U.S. PATENT DOCUMENTS

| | | | |
|---|---|---|---|
| 4,116,911 | 9/1978 | Miyahara et al. | 260/28.5 |
| 4,414,316 | 11/1983 | Conley | 430/496 |
| 4,599,293 | 7/1986 | Eckell et al. | 430/126 |
| 4,754,294 | 6/1988 | Kato | 346/160 |

FOREIGN PATENT DOCUMENTS

| | | |
|---|---|---|
| 0294122 | 12/1988 | European Pat. Off. . |
| 57-196265 | 12/1982 | Japan . |
| 59-083184 | 5/1984 | Japan . |
| WO 9118304 | 11/1991 | WIPO . |

OTHER PUBLICATIONS

European Search Report, dated Oct. 30, 1996, 3 pages.

*Primary Examiner*—Christopher G. Young
*Attorney, Agent, or Firm*—Webb Ziesenheim Bruening Logsdon Orkin & Hanson, P.C.

[57] ABSTRACT

In the manufacture of a screen suitable for use as a rear projection screen, a first layer (10) of a photopolymerisable monomer or oligomer which is tacky in its monomeric or oligomeric form and non-tacky in its polymerised form, is exposed to polymerising light, such as ultra-violet light, in a pattern comprising an array of spots of such light, and consequent selective polymerisation is allowed to take place in the first layer (10). There is then applied to the exposed surface of the first layer (10) a printing medium comprising an opaque pigment layer (28) on a supporting substrate (30) so that the pigment layer (28) contacts the exposed surface of the first layer (10) and sticks to the unpolymerised and therefore still tacky regions of the first layer (10), but not to the polymerised regions. The substrate (30) carrying the pigment layer (28) is then stripped from the first layer (10), leaving pigment (28) adhering only to the unpolymerised regions. The adhering pigment (28) may form a contrast enhancing mask over the regions intermediate the exposed spots of photopolymer, which form microlenses.

14 Claims, 3 Drawing Sheets

METHOD OF IMPARTING CONTRAST ENHANCEMENT PROPERTIES TO DIFFUSING, DEPIXELATING OR PROJECTION SCREENS

THIS INVENTION relates to screens for diffusing, depixelating or projection screens and to means for enhancing contrast in image display devices, including projection screens, such as rear projection screens, as well as c.r.t. displays, LCD displays and the like.

In one of its aspects, the invention relates to the manufacture of a screen, for example a diffusing or depixelating screen, which is formed by selective polymerisation of a light-transmitting photo-polymerisable monomer by exposing the monomer to a pattern of illumination with localised variations in intensity of illumination. Such a screen is hereinafter referred to as being "as herein defined". Such a screen may, for example, bear an array of microlenses, formed by exposing such a monomer to a polymerising light pattern comprising a corresponding array of spots of light.

Where a screen comprising an array of microlenses is used as a projection screen, the contrast in the perceived image is improved by providing an opaque, preferably black, matrix between the individual lenses. It is an object of the present invention to provide an improved method of forming such a matrix in manufacture of a photopolymer screen incorporating an array of graded refractive index lenses.

According to one aspect of the invention there is provided a method of forming a microlens screen, as herein defined, having improved surface relief characteristics, comprising the steps of:

(a) providing a first layer of a photopolymerisable monomer which is tacky in its monomeric form and non-tacky in its polymerised form, (b) exposing said first layer to polymerising light in a pattern with localised variation in intensity of illumination and allowing consequent selective polymerisation of said first layer, (c) applying to an exposed surface of said first layer a printing medium comprising an opaque pigment layer on a supporting stratum so that said pigment layer is brought into direct contact with said exposed surface of said first layer, and adheres to the unpolymerised and therefore still tacky regions of said first layer, the pigment layer having minimal tensile strength and being only weakly bonded to said supporting stratum, the supporting stratum being thereafter pulled away from the said first layer leaving the pigment still adhering to said tacky regions but carrying with said supporting stratum the pigment previously contacting the non-tacky photopolymerised regions.

WO91/18304, incorporated herein by reference, discloses a technique for forming a microlens screen in which microlenses are formed by selective exposure of a photopolymerisable monomer to a pattern of dots or spots of light, such exposure being in ultra-violet light or suitable visible light and in which one surface of the monomer is unconstrained, being exposed to the atmosphere during exposure and consequent polymerisation of the material, (instead, for example, of being covered by a protective plastics sheet in intimate contact with such surface). Under these conditions, each area of the monomer exposed to a respective spot of light, in polymerising selectivity, forms a respective graded refractive index and the exposed surface of the respective area forms a part-spherical or quasi-spherical bulge or dome which enhances the effect of the localised refractive index gradation.

It is another object of the present invention to provide a method of manufacturing a microlens screen as herein defined having an enhanced surface relief characteristic.

Thus, in a preferred embodiment of the first-noted aspect of the invention, after said supporting stratum has been pulled away from said first layer, there is subsequently applied to the surface of the first layer, thus printed with said pigment, a second layer of said photopolymerisable monomer, the surface of said second layer remote from said first layer being left unconstrained, and said second layer is exposed to polymerising radiation through said first layer and thus through the printed pigment pattern now located between said second monomer layer and said first layer, whereby said pigment pattern acts as an optical printing mask with respect to said second layer. As a result said second layer is selectively polymerised and the exposed surface of said second layer caused to adopt a corresponding surface pattern or configuration.

In a variant of the invention, in a yet further aspect, a first layer of a photopolymerisable monomer may be printed with the desired mask pattern by any means prior to polymerisation of said first layer, and the first layer subjected to light exposure through the layer of printing pigment to start polymerisation of the first layer, following which a second layer of photopolymerisable monomer is applied to the printed side of the first layer and subsequently the second layer exposed through said first layer and said printing layer.

An alternative means is provided, in accordance with a further aspect of the invention, for producing a projection screen affording enhanced contrast.

According to this aspect of the invention, there is provided a light-transmitting photopolymerisable material incorporating a light-filtering dye or dye mixture.

Advantageously, the dye (or mixture of dyes) may be neutral in colour, that is to say, the effect of the dye is merely to attenuate the light passing through the material without preference to any particular colour or range of colours.

According to another aspect of the invention, there is provided a screen which is formed by selective polymerisation of a light-transmitting photopolymerisable monomer incorporating such a dye, by exposing the monomer to a pattern of illumination with localised variations in intensity of illumination, to produce corresponding localised variations in the degree of polymerisation and hence to produce corresponding variations in refractive index and/or localised variations in thickness of the sheet or in relief height of one or both surfaces of the sheet.

The screens in accordance with the invention may be used, for example, as rear projection screens, or as depixelating or diffusion screens intended to be placed in front of an LCD display or screen or a CRT screen for depixelating purposes, for example.

It is a further object of the invention to provide an improved means of increasing the contrast in the image displayed by display devices, particularly such devices as are normally viewed under relatively high levels of ambient lighting, such as display devices utilising rear projection screens, c.r.t. display devices, such as television tubes, VDUs, back-lit LCD displays and so on.

It is a known disadvantage, in such devices, that ambient light reflected from portions of the display screen which are at the relevant instant intended to be displaying a dark part of the respective image reduces the ratio of the perceived brightness of the bright parts of the image to the perceived brightness of the dark parts of the image, that is to say reduces the contrast in the perceived image. Thus the ambient light reflected or scattered from the screen tends to wash out both the tonal contrast and the colour of the image. Techniques known for combatting this contrast-reducing effect include light-transmitting sheets or films incorporating pigments or dyes (ideally neutral-density dyes) in front of the image screen. Whilst this technique also reduces the light reaching the viewer from the bright parts of the image, the pigments or dyes reduce the ambient light falling on the image screen and the reduced reflected light is further reduced in the same ratio as that from the bright parts of the image, in passing out to the viewer. Other techniques used include blackening any parts of the image screen which make no contribution to the viewed image, such as the spaces between phosphor dots in a colour T.V. tube, or the inter-pixel spaces in a pixelated LCD display.

It is a yet further object of the present invention to provide an improved means of combatting contrast-reduction in displays of the character referred to, for example to provide an improved screen for this purpose, to be placed in front of a rear projection screen or other image display screen.

According to a yet further aspect of the invention, therefore, there is provided a method of imparting contrast enhancement properties to a transparent or translucent substrate, comprising the steps of
(a) providing a transfer medium;
(b) producing a contrast-enhancing pattern on a face of said transfer medium;
(c) contacting said contrast-enhancing pattern with a transparent or translucent substrate, and
(d) transferring said contrast-enhancing pattern to said transparent or translucent substrate.

According to another aspect of the invention, there is provided a transparent or translucent substrate having a contrast enhancing pattern on at least one face thereof, said contrast enhancing pattern formed from fusible plastics incorporating a pigment, said plastics being adhered to said face of the substrate.

An embodiment of the invention is described below, by way of example, with reference to the accompanying drawings, in which.

In one embodiment of the present invention, described below, a photopolymer is used which may be that supplied by Du Pont under the Registered Trade Mark OMNIDEX and having the type designation HRF150 or HRF600. The monomer in the HRF series photopolymers is fluorescent N-vinyl-carbazole (NVC) dispersed in a plasticized polyvinyl acetate (PVAC), cellulose acetate butyrate (CAB) or polyvinyl butyrate (PVB) as the polymeric binder. The material may be initiated either by photoinitiators or by a photosensitizing dye/initiator combination.

Figure 1:
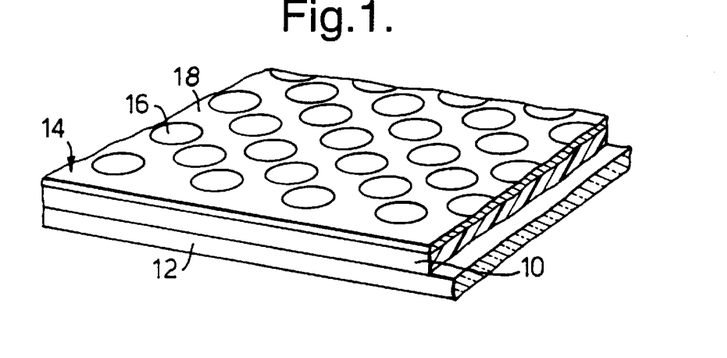
FIG. 1 is a fragmentary perspective view illustrating an arrangement for selective exposure of a layer of photopolymerisable material, in the first stages of a method in accordance with the invention.
Figure 2:
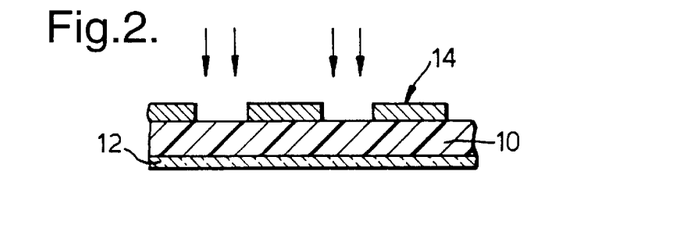
FIG. 2 is a schematic view in vertical section of the arrangement of FIG. 1.
Figure 8:
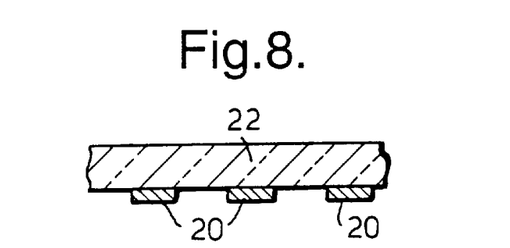
FIG. 8 is a schematic sectional view of a fragment of an optical mask.

The OMNIDEX materials are available in sheet form, comprising a layer of the monomer on a polyester film base (MYLAR) the layer being entirely covered with a polyester (MYLAR) film. Referring to the drawings, in the preferred embodiment of the invention, a layer 10 of a photopolymerisable monomer on a transparent polyester film base 12 is exposed to ultraviolet light through a photographic contact printing screen, indicated at 14, comprising a pattern of light-transmitting patches or "apertures" 16 in an opaque background 18. The contact printing screen may comprise, for example, an array of circular apertures in an otherwise opaque layer or may comprise a random or pseudo-random array of regular or irregular light transmitting patches or apertures, depending upon the desired nature of the resulting photopolymer screen. The monomer layer 10 and base 12 may be provided by the OMNIDEX material referred to above. Whilst, in principle, the photographic contact printing could be effected through the upper MYLAR film of the OMNIDEX material, where, as is preferred, the dimensions and separation of the printing screen "apertures" 16 are comparable with the thickness of the upper polyester film (not shown), it is necessary to strip the upper polyester film from the monomer and to contact the exposed monomer surface directly with the printing screen, as illustrated in FIG. 1. The printing screen 14 may, for example, as illustrated in FIG. 8, comprise a thin layer 20 of chromium upon a glass substrate 22, with the chromium 20 being etched away in the regions of the screen "apertures" 16.

Figure 3:
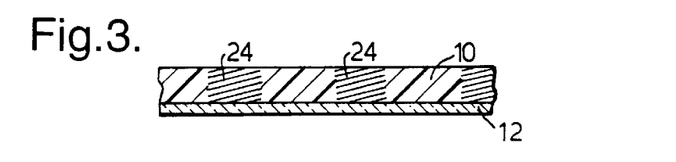
FIG. 3 is a schematic view similar to FIG. 2 but illustrating the condition after selective exposure.

After the polymerisation resulting from this first exposure, the contact printing screen 14 is stripped from the photopolymer layer 10 (see FIG. 3). As a result of the selective polymerisation of the monomer in the regions (indicated at 24 in FIGS. 3 to 6) which have been exposed to UV light, the material in these regions becomes relatively non-tacky. The monomer in its unexposed state has the form of a solid layer which is, nevertheless, intrinsically tacky. In the regions of the monomer layer where the latter has not been exposed to UV light, it remains tacky. A further result of such selective polymerisation is, of course, that an array of microlenses is formed in the photopolymer layer, in the manner described in WO91/18304.

Figure 4:
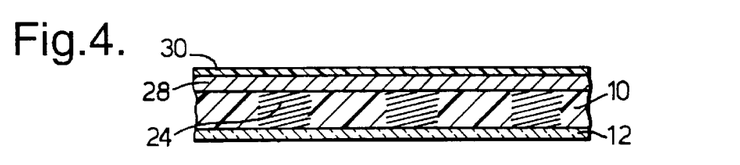
FIGS. 4 to 7 are schematic sectional view similar to FIG. 3 but illustrating subsequent steps in the method.
Figure 5:
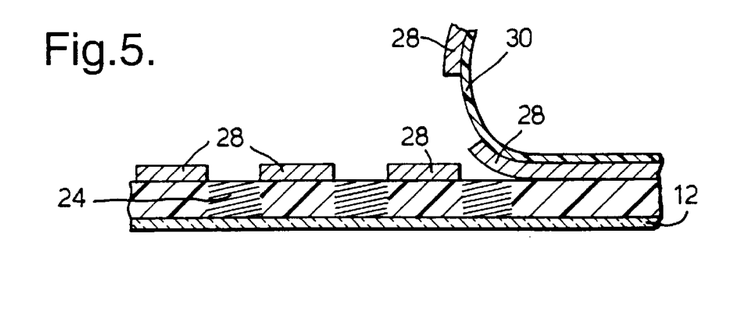

Referring to FIG. 4, there is now applied to the surface of the monomer/photopolymer layer 10 a printing medium comprising an opaque pigment layer 28 (preferably a black pigment layer) on a flexible supporting stratum 30 (e.g. of MYLAR film) so that the pigment layer 28 is brought into direct contact with the surface of the monomer/polymer layer 10 and adheres to the unpolymerised and therefore still tacky regions of the material 10. The pigment layer 28 has minimal tensile strength and is only weakly bonded to the supporting MYLAR stratum 30 so that when the supporting stratum is thereafter pulled away, as illustrated in FIG. 5, from the monomer/photopolymer layer 10, the pigment is left adhering to the tacky regions of the photopolymer/monomer layer 10 but is pulled away, with the supporting stratum 30, from the polymerised regions. As a result, there is left adhering to the surface of the monomer/photopolymer a replica of the contact printing screen 14 through which the monomer layer 10 was initially exposed to UV light. A suitable material for the medium comprising the pigment layer on its supporting stratum is that supplied under the Trade Mark CROMALIN by Du Pont.

Figure 6:
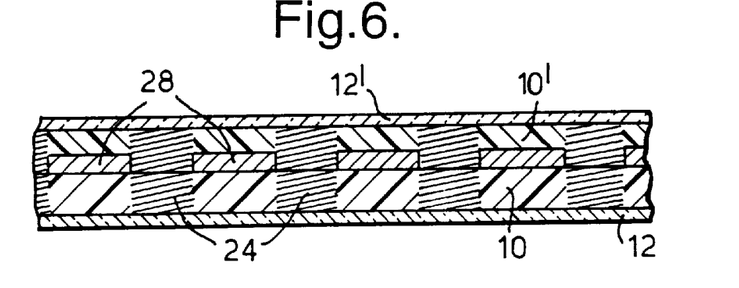
Figure 7:
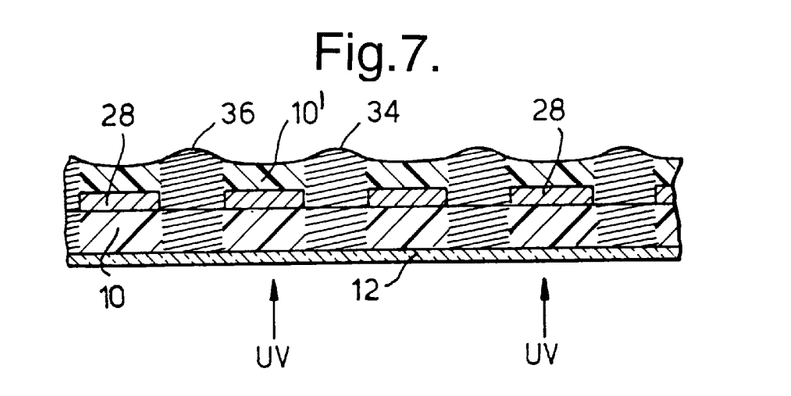

In the next step of the process, the protective upper MYLAR film is stripped from a further sheet of the OMNIDEX monomer layer/MYLAR sandwich product and the thus-exposed surface of the second monomer layer 10' is pressed onto the pigment-patterned surface of the previously exposed photopolymer/monomer layer 10. This stage is illustrated in FIG. 6 in which the further sheet is inverted so that the substrate 12' is uppermost. The unexposed monomer 10' adheres well to the corresponding polymer 24 exposed in the "apertures" in the pigment 28 "mask" so that it is possible thereafter to strip the MYLAR backing film 12' from the second monomer layer 10'. The second monomer layer 10' is then exposed to ultraviolet light through the first monomer/polymer layer 10 and through the CROMALIN mask thereby (a) giving the first layer 10 a blanketing exposure which polymerises the material in the first layer 10 which until then was unpolymerised and (b) selectively exposing the material in the second layer 10' through the apertures in the pigment "mask". As a result, the material in the regions, thus exposed to light, of the second layer 10', commences polymerisation, with consequent migration of molecules into the regions undergoing polymerisation from the surrounding regions, with the result that, in the second layer, a respective pronounced dome or protuberance 34 is formed, on the surface remote from the pigment layer, over each aperture in the pigment mask as illustrated in FIG. 7. The last-noted surface is free to adopt this configuration because it is unrestrained by any MYLAR film, for example.

Finally, the product is given a blanketing exposure to ultraviolet light from the opposite side of the product, i.e. from the contoured side. Because of the strong bonding which occurs between the portions of the two superimposed layers 10, 10' in the areas of the apertures in the pigment layer, the resulting product has a high integrity. The pigment layer serves to prevent unwanted light passing through the resulting screen otherwise than through the selectively polymerised regions. There is thus formed a microlens screen comprising an array of microlenses, (owing their optical effect partly to refractive index gradations and partially to surface configuration, with the regions between microlenses being black and opaque to light). Such a screen is of particularly utility as a rear-projection screen, as the possibility of spurious reflection of light from and transmission of light through the regions between the lenses and which is not derived from the image source is much reduced and thus contrast is increased.

As indicated above, in another embodiment of the invention, (not illustrated) a neutral-coloured dye or mixture of dyes is incorporated in a light-diffusing (e.g. rear-projection) screen.

European Patent No. EP0294122, incorporated herein by reference, discloses a technique for forming a microlens screen in which the graded refractive index lenses are formed by selective exposure of a sheet of photopolymerisable monomer to a pattern of dots, to form a corresponding array of microlenses and in which microlenses are in the form of graded refractive index lenses. Thus, the microlens screen comprises an integral sheet of transparent photopolymer with each of the lenses being formed by a respective region of the sheet extending between the surface of the sheet, with the refractive index, in said region, varying with radial distance from the optical axis of each said lens. Published International Patent Applications WO92/16075 and WO91/18304, also incorporated herein by reference, disclose, respectively, the use of such a microlens screen in front of an LCD display for depixelating purposes and the use of such a screen in front of CRT screens, etc. for analogous purposes. It has been found that, in certain circumstances, the use of such a microlens screen in such context can result in a "halo" effect. Furthermore, with some photopolymer materials the microlens screen results in a perceived "yellowing" of the viewed image. In order to avoid these disadvantages, and to provide improved contrast, it is proposed to incorporate a dye into the photopolymer, or at least into the monomer prior to photopolymerisation. Preferably, the dye is neutral, in the sense that it merely serves to darken the material slightly without imparting any particular hue to it. However, where it is found that the photopolymer material itself imparts a coloration to light passing through it, for example, tends to "yellow" the light passing through it, this may be compensated for by using a dye with a complementary hue so that the light passing through the finished product does not receive any particular coloration. The resulting photopolymer screen thus acts as a neutral density filter in addition to its light scattering, etc. properties. Thus, the addition of a small amount of neutral "grey" pigment is suggested.

In one embodiment, in which the photopolymer layer is about 100 microns thick, the optical density of the resulting "neutral density filter" is around 0.3. The effect of the neutral density filtering is to reduce scatter from unwanted artifacts in the medium, such as photo-phase boundaries etc. In this regard, the effect is analogous with the techniques commonly used in the preparation of photographic emulsions where anti-halation dyes are used to depress grain scatter and increase resolution. A further effect of the neutral density filtering is to reduce the amount of ambient light scattered by the microlens screen towards the viewer and thus to increase the perceived contrast of the image.

Where, in the finished product, the photopolymer is laminated with a plastics film, for example a MYLAR film, or is sandwiched between two such films, then such film or films, in addition to, or instead of, the photopolymer material, may incorporate the neutral density dye.

A further technique (in accordance with the invention) by which contrast may be improved in projection and other image presentation systems is described below.

In this technique a contrast-enhancing deposit of a dark, for example black, medium is applied to a substrate, which substrate may itself be, for example, a rear projection or diffusing screen of plastics or glass (such as a photopolymeric graded refractive index screen of the type disclosed in EP-0294122, or a diffusing screen of the type disclosed in U.S. Pat. No. 3658526 or EP 0381417 comprising particles of plastics of a first refractive index embedded in a plastics matrix of a second refractive index, or an embossed plastics screen or even simply a ground glass plate). The substrate may, alternatively, be a transparent sheet intended to be placed in front of, for example, a rear projection screen, c.r.t. display (such as a television tube screen or VDU), back lit LCD display) in order to combat loss of contrast due to reflected ambient light. The deposit is applied in such a manner that there are regions of the substrate which are covered by such deposit and regions which are free of such deposit. Any such distribution of the medium is herein referred to as a "pattern", but it should be appreciated that this term is not to be understood as being limited to patterns of regularly repeating pattern "cells" although the term is also intended to include such. For example, the medium may be deposited in a regular pattern of dots, in a pattern similar to that of a half-tone photographic screen, or in a grid of parallel lines, or as a random scattering of patches of the medium over the substrate.

In preferred embodiments, the medium comprises a heat fusible polymer having an opaque dark pigment dispersed therethrough, and is placed upon the substrate in the desired pattern and subjected to heat (and preferably pressure) to fuse the medium and cause the medium to adhere to the substrate. The medium may comprise electrophotographic toner and may be applied directly to the substrate by an electrophotographic process, or may be applied to a transfer sheet by an electrophotographic process, (for example by photocopier or computer controlled laser printer, which, for the purposes of the present application is to be regarded as included in the term "electrophotographic printer"), the transfer sheet being subsequently applied to the substrate to which the pattern is to be applied, with the side of the transfer sheet bearing the toner deposit contacting the substrate, the transfer sheet being pressed against the substrate whilst being subjected to heat, to fuse the toner and cause it to adhere to the substrate, and the transfer sheet subsequently peeled from the substrate.

The medium to be applied to the substrate may, however, be applied to the substrate or to the transfer paper in some way other than by an electrophotographic process. For example, the medium may be incorporated in an ink which may be applied by a conventional printing process to a transfer paper, or directly to the substrate, or may, for example be printed in the desired pattern on the transfer paper (or possibly directly onto a suitable substrate) using an ink-jet printer.

Figure 9:
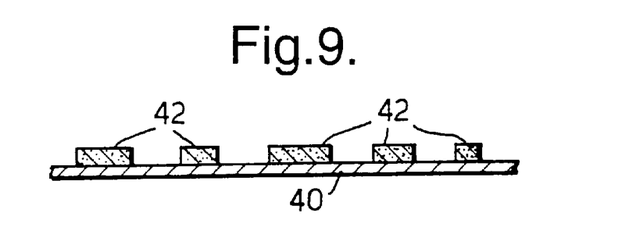
FIG. 9 is a schematic sectional view of a transfer paper printed with electrophotographic toner.
Figure 10:
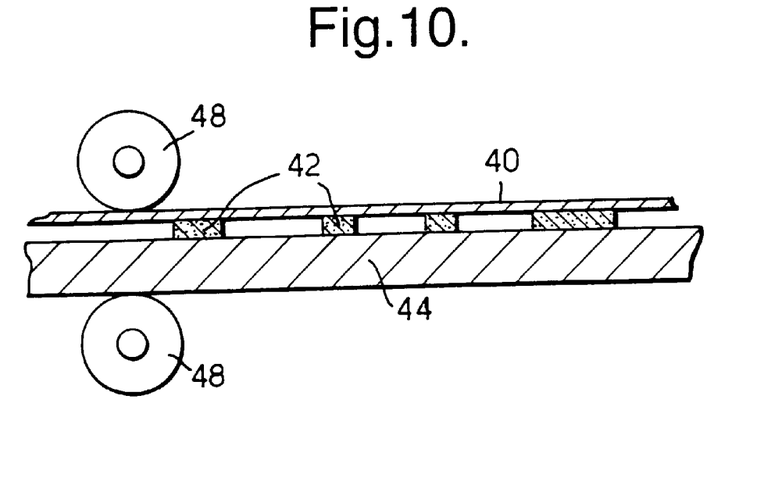
FIG. 10 is a schematic sectional view illustrating the application of the transfer paper to a substrate.
Figure 11:
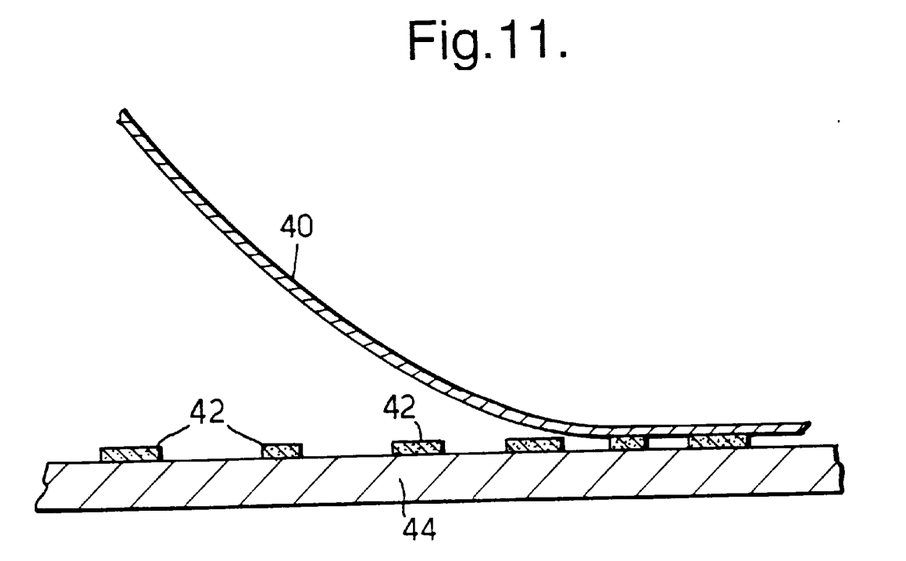
FIG. 11 is a schematic sectional view illustrating the removal of the transfer paper from the substrate leaving the toner adhered to the substrate.

FIG. 9 of the accompanying drawings illustrates a transfer sheet, in the form of a transfer paper 40, after a pattern of fused electrophotographic toner 42 has been applied thereto by an electrophotographic process. The transfer paper is preferably so constituted or treated that the adhesion of the toner 42 thereto is relatively low. Thus, the transfer paper may have, in manner known per se, a release coating on the side to which the toner is applied. FIG. 10 illustrates the position after the transfer paper 40 has been laid face-down upon the substrate 44 which is to receive the toner pattern, so that the toner is adjacent the surface of the substrate. The transfer paper 40 is then applied to the substrate under heat and pressure, (for example by passing the transfer paper and substrate together through the nip between heated pressure rollers 48), so that the toner is melted or fused once again and adheres to the substrate in the same pattern. FIG. 11 illustrates the transfer paper 40 being peeled from the substrate 44 leaving the toner adhered to the substrate 44, the toner being preferentially released from the transfer paper.

Any transfer paper which will receive toner and allow transfer of such toner to a substrate can be used, such as the transfer papers available from Rexham, Kimberly Clark or 3M. The toner pattern used typically consists of small black dots 5–50 μm in size arranged in a random pattern and of sufficient density to achieve no more than the degree of contrast improvement required. Alternatives are regularly patterns, fine lines or stripes, possibly arranged as a pattern, e.g. honeycomb, although regular patterns require a more careful detailed design when used in conjunction with pixel based projection systems.

The contrast-enhancing pattern is advantageously laid down on the release side of the transfer paper using an electrophotographic printer or copier, such as a high-resolution machine such as the Xeikon DCP-1 or the Agfa Chromapress, although any other machine which is capable of producing contrast-enhancing patterns with the required clarity can be used.

The primary requirement for the toner used is that the toner can adhere to the transfer paper, and transfer and adhere to the substrate.

For most applications contrast will be achieved using a black, blue or grey toner, or a combination of these. The toners may be based on styrene/acrylic or polyester resins having a pigment, for example carbon black, dispersed therethrough. However, in practice the "toner"–could be in a solid form (as used in the above equipment) or a liquid. Regardless of the method, the material deposited on the surface of the substrate comprises fusible polymer and pigment plus other ingredients necessitated by the overall process (for example according to whether the process uses liquid toner, solid, polymer based hot-melt toner or ink-jet printers).

The transparent or translucent substrate must be capable of accepting the toner pattern from the transfer paper under the necessary transfer conditions, i.e. it has to be able to withstand the heat required to transfer the pattern. In practice, electrophotographic toners are currently commercially available which have low melting points, e.g. 10020 C. or lower, so that this requirement for the substrate is not particularly restrictive. For commercial applications the toner should adhere permanently to the substrate so the contrast-enhancing pattern does not abrade or otherwise wear off over long periods of use. Exemplary substrates are transparent or translucent glass; or polymeric diffusive materials such as disclosed above. Suitable polymeric diffusive materials include materials based on, for example, acrylics, polycarbonates and polyolefins and photopolymers such as those provided by Du Pont, Polaroid and others, and other polymers with appropriate optical properties.

The contrast-enhancing pattern may be formed directly on the substrate using coloured electrophotographic toner deposited onto the substrate using an electrophotographic process. For example, a flexible, heat-stable polymeric diffusive sheet material in roll form may be fed directly into a Xeikon-type high resolution electrophotographic printer to produce large volumes of contrast-enhanced diffuser. For substrates which cannot be so processed, e.g. brittle glass or particularly heat-sensitive polymers, or substrates which are simply too stiff or thick to pass through the electrophotographic printer available, the transfer paper method may be used.

We claim:

1. A method of imparting contrast enhancement properties to a transparent or translucent substrate, comprising the steps of
   (a) providing a transfer medium;
   (b) producing a contrast-enhancing pattern on a face of said transfer medium;
   (c) contacting said contrast-enhancing pattern with a transparent or translucent substrate, and
   (d) transferring said contrast-enhancing pattern to said transparent or translucent substrate, wherein said substrate comprises a rear projection screen.

2. A method according to claim 1 wherein said contrast enhancing pattern is formed by a fusible polymer incorporating a dye or pigment and said step of transferring is effected by applying heat and pressure.

3. A method according to claim 2 wherein said fusible polymer incorporating dye or pigment comprises electrophotographic toner and is applied to said transfer medium by an electrophotographic process.

4. A method according to claim 1 wherein said substrate comprises a photopolymeric microlens screen in which the microlenses are graded refractive index lenses.

5. A method according to claim 1 wherein said substrate comprises particles of a first refractive index embedded in a plastics matrix of a second refractive index.

6. A method according to claim 1 wherein said substrate comprises an embossed plastics screen.

7. A method according to claim 3 wherein said transfer medium is a transfer sheet having one side to which said fusible polymer is applied in said contrast-enhancing pattern, and in which, in said transferring step, the transfer sheet is applied to said rear projection screen substrate with the side of the transfer sheet bearing the toner deposit contacting the substrate and thereafter the transfer sheet is pressed against the substrate while being subjected to heat, to fuse the toner and cause it to adhere to the substrate, and the transfer sheet is subsequently peeled from the substrate.

8. A method of imparting contract enhancement properties to a transparent or translucent substrate, comprising the steps of:

(a) providing a transfer medium;

(b) producing a contrast-enhancing pattern on a face of said transfer medium; and (c) electrophotographically transferring said contrast-enhancing pattern from said transfer medium to a rear projection screen.

9. A method of imparting contrast enhancement properties to a transparent or translucent substrate, comprising the steps of:

(a) providing a transfer medium;

(b) producing a contrast-enhancing pattern on a face of said transfer medium;

(c) contacting said contrast-enhancing pattern with a transparent or translucent substrate; and (d) transferring said contrast-enhancing pattern to said transparent or translucent substrate, wherein said substrate comprises a depixelating or diffusion screen for placing in front of a back-lit LCD display or a CRT screen for depixelating purposes.

10. A method according to claim 9 wherein said contrast-enhancing pattern is formed by a fusible polymer incorporating a dye or pigment and said step of transferring is effected by applying heat and pressure.

11. A method according to claim 10 wherein said fusible polymer incorporating dye or pigment comprises electrophotographic toner is applied to said transfer medium by an electrophotographic process.

12. A method of making an improved-contrast display, comprising:

providing a back-lit, pixelated LCD display;

providing a depixelating or diffusion screen in the form of a transparent or translucent substrate;

providing a transfer medium;

producing a contrast-enhancing pattern on a face of said transfer medium;

contacting said contrast-enhancing pattern with said transparent or translucent substrate;

transferring said contrast-enhancing pattern to said transparent or translucent substrate; and placing said substrate, with said contrast-enhancing pattern thereon, in front of said LCD display.

13. A method according to claim 12 wherein said contrast-enhancing pattern is formed by a fusible polymer incorporating a dye or pigment and said step of transferring is effected by applying heat and pressure.

14. A method according to claim 13 wherein said fusible polymer incorporating dye or pigment comprises electrophotographic toner and is applied to said transfer medium by an electrophotographic process.

* * * * *

UNITED STATES PATENT AND TRADEMARK OFFICE
CERTIFICATE OF CORRECTION

PATENT NO. : 5,897,980                                          Page 1 of 2
DATED      : April 27, 1999
INVENTOR(S): Nicholas John Phillips et al.

It is certified that error appears in the above-identified patent and that said Letters Patent is hereby corrected as shown below:

Column 1 Line 8 "c.r.t." should read --CRT--.

Column 1 Line 59 after "material" delete comma --,--.

Column 1 Line 60 "plastics sheet" should read --plastic sheet--.

Column 2 Line 58 "c.r.t." should read --CRT--.

Column 3 Line 47 "sectional view" should read --sectional views--.

Column 4 Line 47 "monomer/polymer" should read
--monomer/photopolymer--.

Column 5 Line 9 "monomer/polymer" should read
--monomer/photopolymer--.

Column 5 Line 37 "particularly" should read --particular--.

Column 6 Line 47 "c.r.t." should read --CRT--.

Column 6 Line 49 after "LCD display" delete --)--.

Column 7 Line 48 "regularly" should read --regular--.

Column 7 Line 67 after "'toner'" delete dashes (--).

Column 8 Line 13 "e.g. 10020" should read --e.g. 100°--.

Column 9 Line 8 Claim 8 "contract" should read --contrast--.

UNITED STATES PATENT AND TRADEMARK OFFICE
CERTIFICATE OF CORRECTION

PATENT NO.  : 5,897,980
DATED       : April 27, 1999
INVENTOR(S) : Nicholas John Phillips et al.

It is certified that error appears in the above-identified patent and that said Letters Patent is hereby corrected as shown below:

Column 10 Line 4 Claim 11 "comprises" should read --comprising--.

Signed and Sealed this

Twelfth Day of October, 1999

Q. TODD DICKINSON

Attest:

Attesting Officer

Acting Commissioner of Patents and Trademarks